(12) United States Patent
Hsiao

(10) Patent No.: US 8,419,328 B2
(45) Date of Patent: Apr. 16, 2013

(54) CONTAINER DATA CENTER

(75) Inventor: Sheng-Chung Hsiao, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 8 days.

(21) Appl. No.: 13/244,624

(22) Filed: Sep. 25, 2011

(65) Prior Publication Data

US 2012/0318708 A1     Dec. 20, 2012

(30) Foreign Application Priority Data

Jun. 16, 2011   (TW) .............................. 100120968 A

(51) Int. Cl.
*B61D 45/00*     (2006.01)

(52) U.S. Cl.
USPC .......................................................... 410/87

(58) Field of Classification Search ...................... 410/87
See application file for complete search history.

(56) References Cited

U.S. PATENT DOCUMENTS

| | | | | | |
|---|---|---|---|---|---|
| 599,259 | A | * | 2/1898 | Saunders | 267/289 |
| 699,709 | A | * | 5/1902 | Pulbrook | 267/33 |
| 1,085,237 | A | * | 1/1914 | Bell | 410/51 |
| 1,398,810 | A | * | 11/1921 | Story | 280/143 |
| 4,227,843 | A | * | 10/1980 | Damm | 410/54 |
| 5,417,496 | A | * | 5/1995 | Hobbs | 384/18 |
| 5,819,943 | A | * | 10/1998 | Depuy | 206/522 |
| 7,520,706 | B2 | * | 4/2009 | Winsor | 410/7 |

* cited by examiner

*Primary Examiner* — H Gutman
(74) *Attorney, Agent, or Firm* — Altis Law Group, Inc.

(57) ABSTRACT

A container data center includes a container, and a number of cabinets arranged in the container. A first shockproof device is mounted to the bottom of each of the cabinets, and a second shockproof device is mounted to the top of each of the cabinets. The second shockproof device includes a shockproof member and a connecting apparatus connected between the shockproof member and the container. A distance between the shockproof member and the top of the container is adjustable for keeping the shockproof member abutting the top wall of the cabinet.

11 Claims, 10 Drawing Sheets

CONTAINER DATA CENTER

CROSS-REFERENCE OF RELATED APPLICATION

Relevant subject matter is disclosed in a pending U.S. patent application, titled "CONTAINER DATA CENTER", with the application Ser. No. 13/237,951, filed on Sep. 21, 2011, which is assigned to the same assignee as this patent application.

BACKGROUND

1. Technical Field

The present disclosure relates to a container data center.

2. Description of Related Art

A container data center includes a container, and a number of cabinets each holding one or more servers and received in the container. However, during transportation of the container data center, the servers may be damaged due to vibrations or shocks.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

The present disclosure, including the accompanying drawings, is illustrated by way of examples and not by way of limitation. It should be noted that references to "an" or "one" embodiment in this disclosure are not necessarily to the same embodiment, and such references mean at least one.

Figure 1:
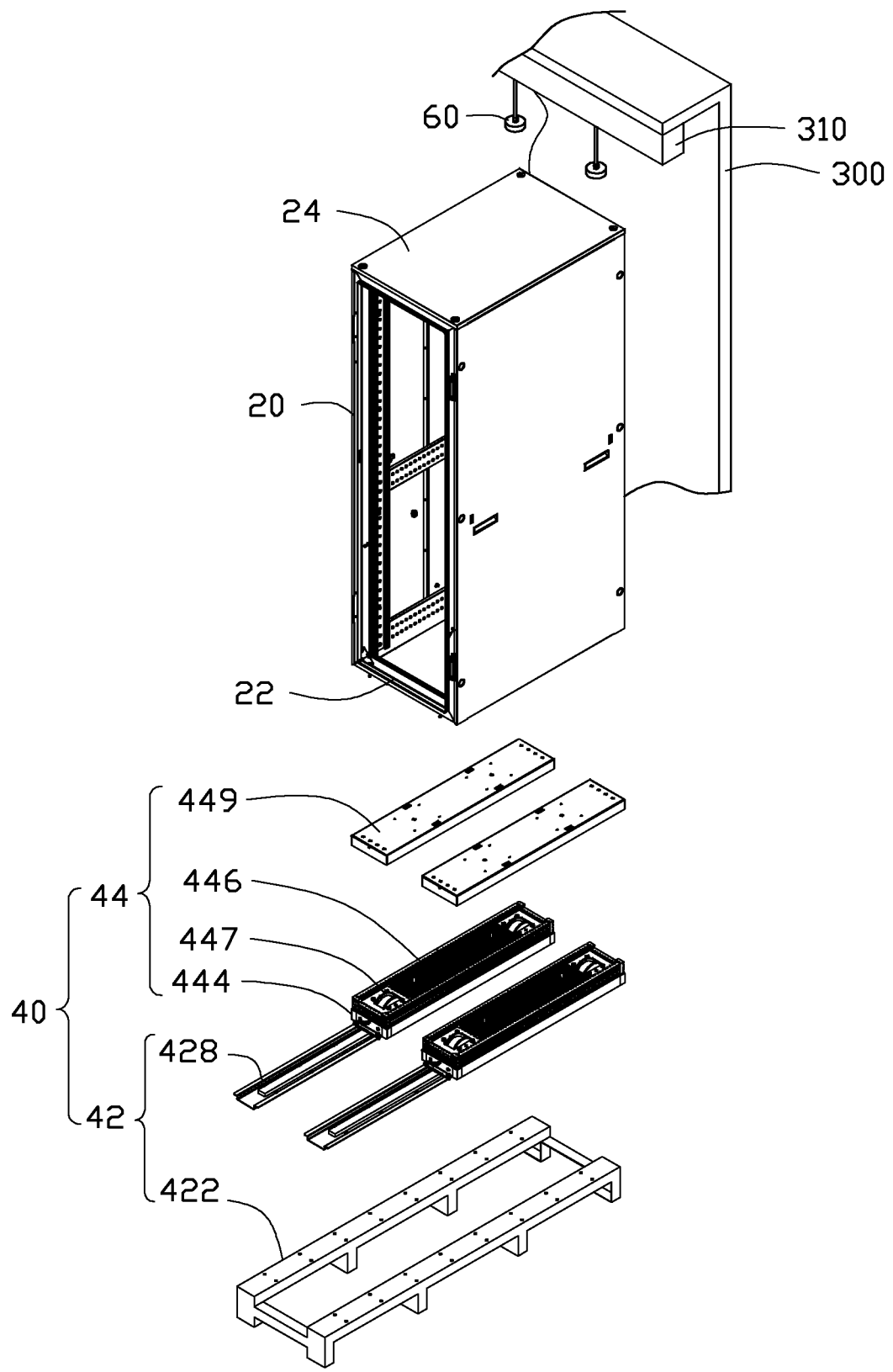
FIG. 1 is an exploded, isometric view of a first exemplary embodiment of a container data center, wherein the container data center includes a first shockproof device and a second shockproof device.
Figure 2:
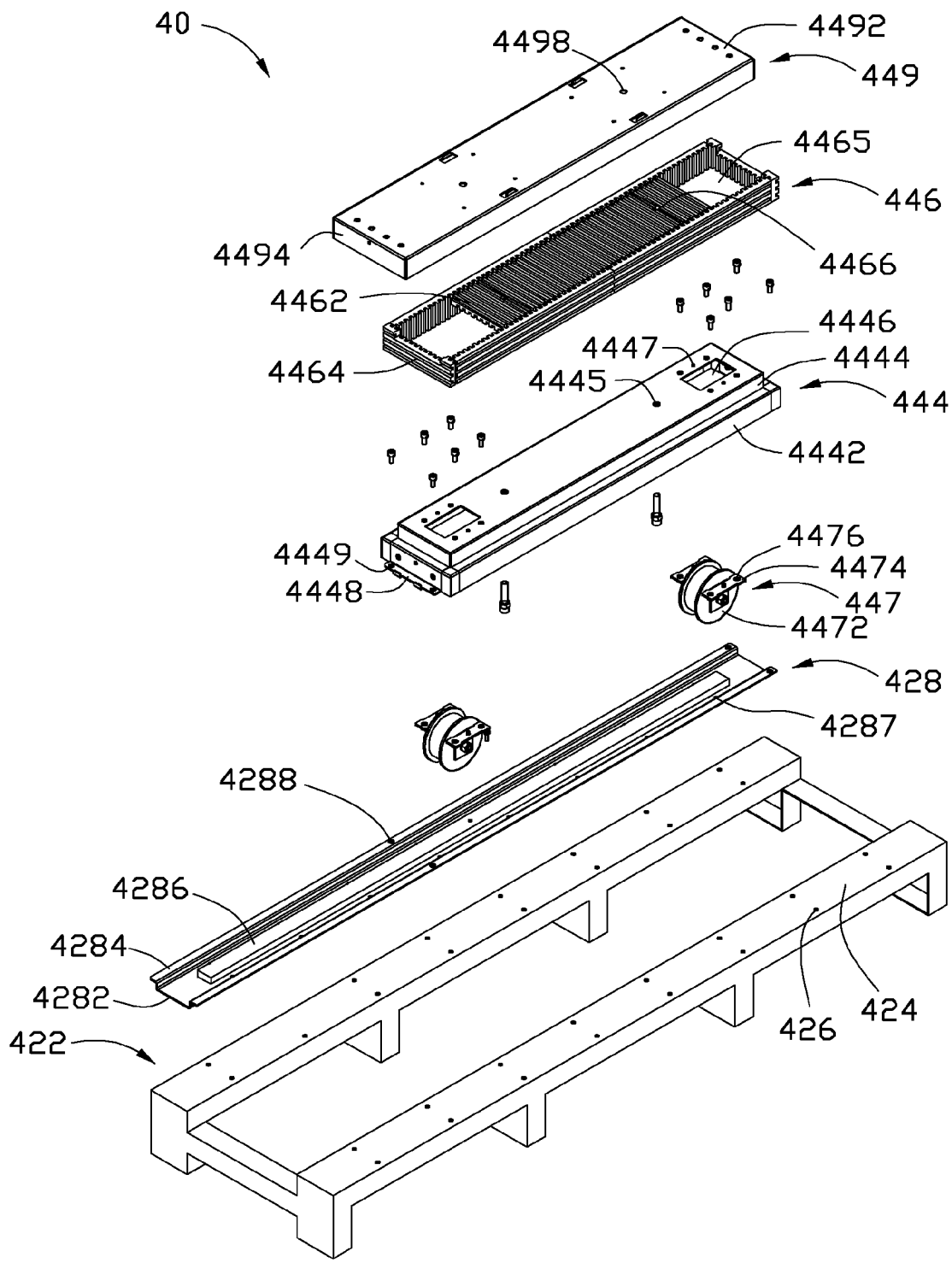
FIG. 2 is an exploded, isometric view of the first shockproof device of FIG. 1.

Referring to FIG. 1 and FIG. 2, a first exemplary embodiment of a container data center includes a container 300, and a number of cabinets 20 arranged in the container 300. Each cabinet 20 includes a bottom wall 22 and a top wall 24 opposite to the bottom wall 22. A first shockproof device 40 is mounted to the bottom of the bottom wall 22, and two second shockproof devices 60 are mounted to the top of the top wall 24. One or more servers (not shown) may be installed in each cabinet 20.

The container 300 includes a fixing bracket 310 mounted on an inner surface of the top wall of the container 300. The fixing bracket 310 defines a plurality of screw holes 302 (shown in FIG. 5).

The first shockproof device 40 includes a supporting apparatus 42 and two parallel sliding apparatuses 44.

The supporting apparatus 42 includes a bracket 422, and two parallel slide rails 428 mounted on the bracket 422 for supporting the corresponding sliding apparatuses 44. The bracket 422 includes two parallel supporting bars 424. Each supporting bar 424 defines a plurality of screw holes 426. Each slide rail 428 includes a long bottom plate 4282, two L-shaped supporting plates 4284 extending up from the two opposite sides of the bottom plate 4282, and a slide bar 4286 mounted on the top of the bottom plate 4282. The bottom plate 4282 defines a plurality of through holes 4287. Each supporting plate 4284 defines a plurality of fastening holes 4288.

Each sliding apparatus 44 includes an installing frame 444, a first shockproof member 446, two wheel members 447, and a cover 449.

The installing frame 444 includes a long slide portion 4442, and a drawer-shaped fixing portion 4444 extending up from the middle of the slide portion 4442. The top of the fixing portion 4444 defines two rectangular installing holes 446 in the two opposite ends, and two mounting holes 4445 between the installing holes 446. A plurality of through holes 4447 is defined in the fixing portion 4444, at the two opposite sides of each installing hole 4446. A fixing plate 4448 extends out from the front end of the bottom of the slide portion 4442, and defines two through holes 4449.

The first shockproof member 446 includes four shockproof blocks 4464 connected to form a rectangular frame, and a rectangular shockproof piece 4462 connected between the tops of two shockproof blocks 4464 at the two opposite sides of the frame. An opening 4465 is defined between the shockproof piece 4462 and the top of each shockproof block 4464 at the opposite ends of the frame. The shockproof piece 4462 defines two through holes 4466, adjacent to the corresponding openings 4465. In the embodiment, the shockproof piece 4462 and the shockproof block 4464 are made of shockproof material, such as plastic or rubber.

Each wheel member 447 includes a wheel 4472 and two L-shaped connecting plates 4474 respectively mounted on the two opposite sides of the wheel 4472. Each connecting plate 4474 defines a plurality of screw holes 4476.

The cover 449 includes a rectangular top plate 4492 and four side plates 4494 extending down from the four sides of the top plate 4492. The top plate 4492 and the side plates 4494 form a receiving slot 4496 (shown in FIG. 5) for receiving the first shockproof member 446. The top plate 4492 defines two fixing holes 4498.

Figure 3:
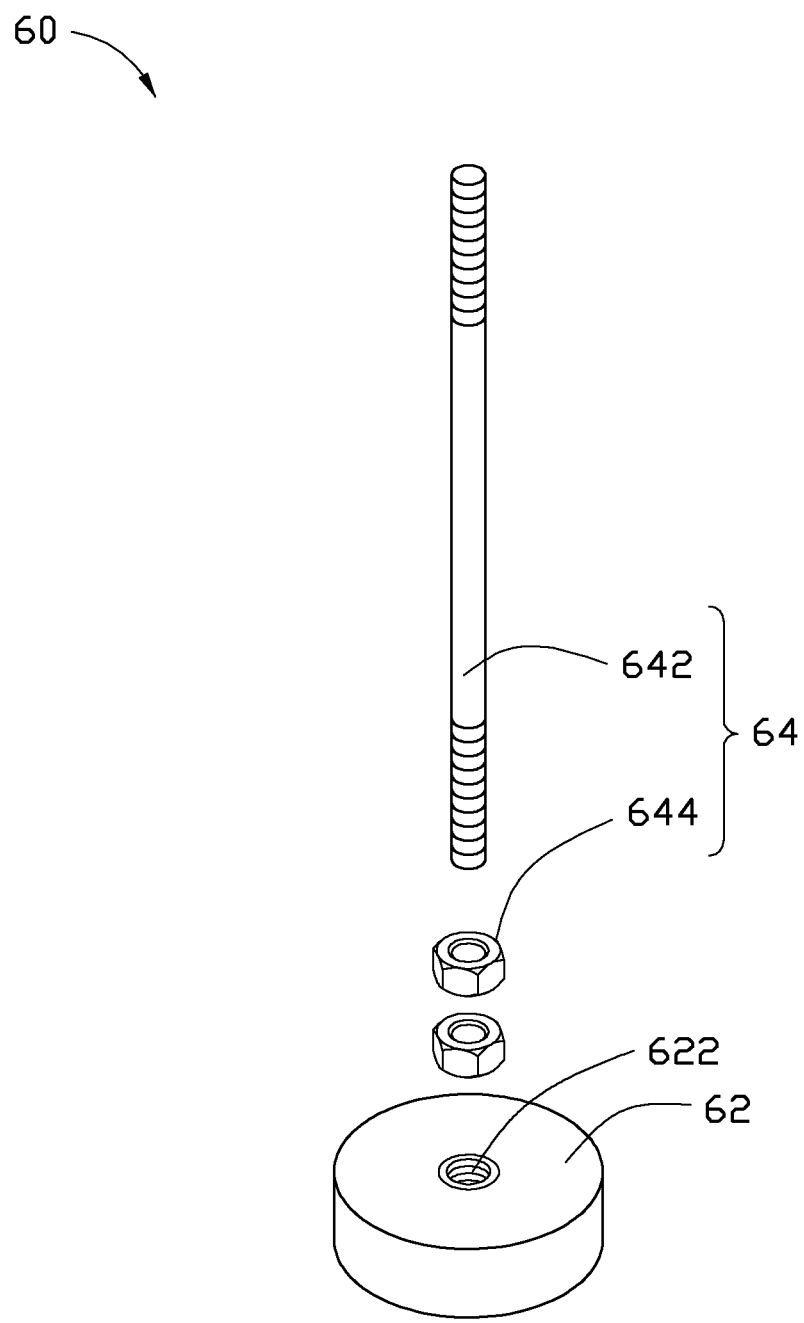
FIG. 3 is an exploded, isometric view of the second shockproof device of FIG. 1.

Referring to FIG. 3, each second shockproof device 60 includes a second shockproof member 62, and a connecting member 64.

The second shockproof member 62 is substantially cylindrical, and axially defines a screw hole 622. The connecting member 64 includes a connecting pole 642, and two nuts 644. The connecting pole 642 is threaded at both ends. In the embodiment, the second shockproof member 62 is made of shockproof material, such as plastic or rubber.

Figure 4:
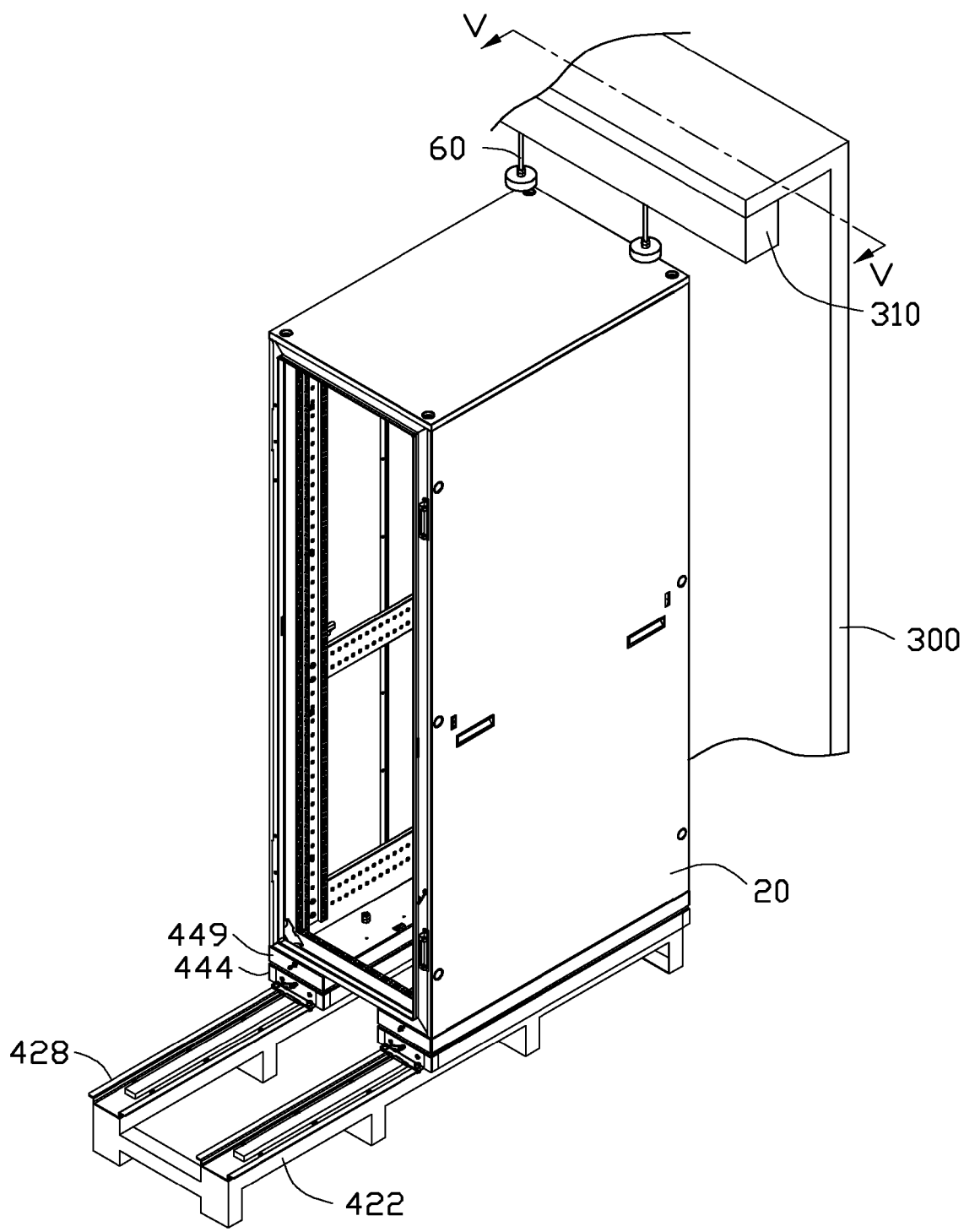
FIG. 4 is an isometric view of the assembled container data center of FIG. 1.
Figure 5:
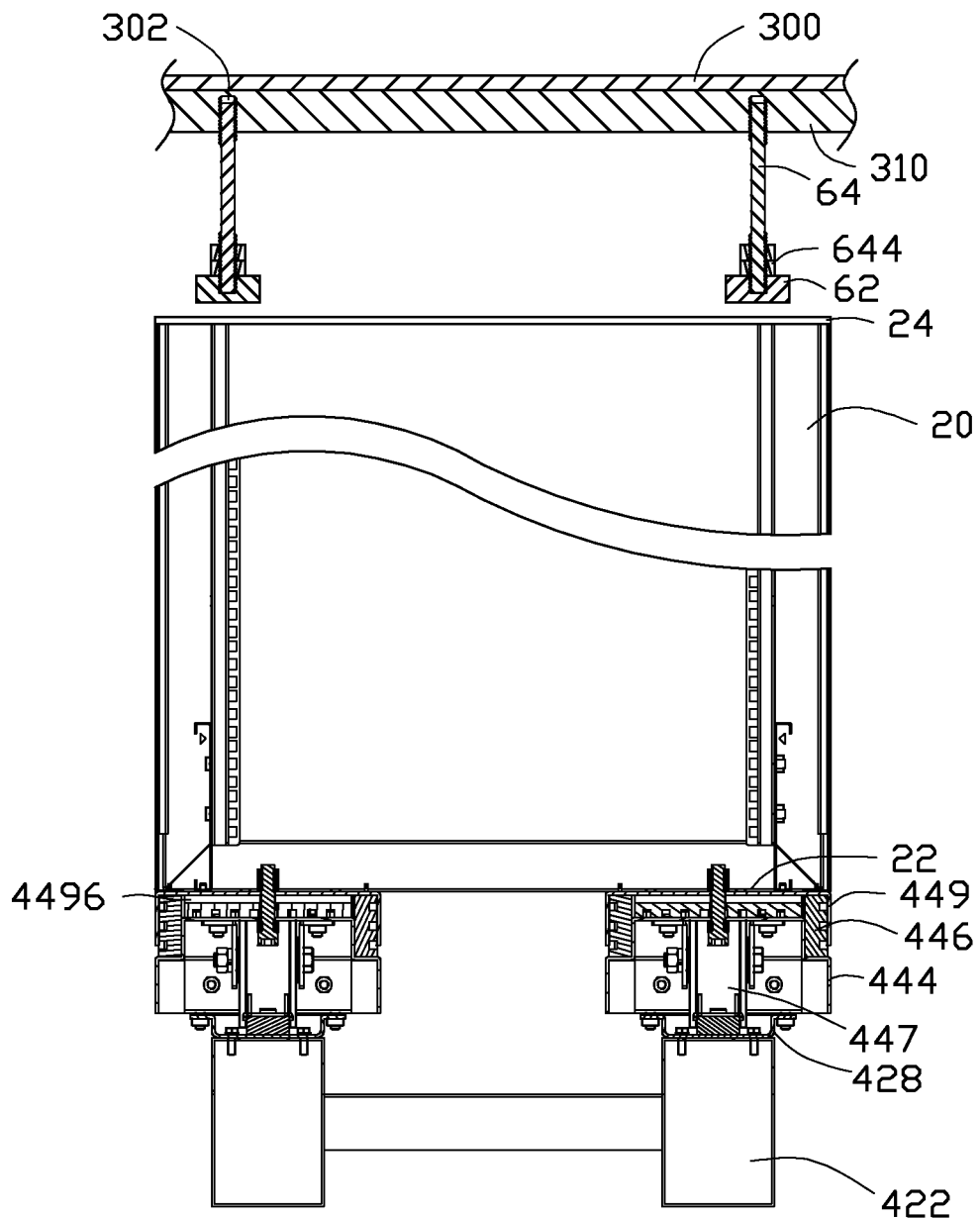
FIG. 5 is a cross-sectional view of FIG. 4, taken along the line of V-V.
Figure 6:
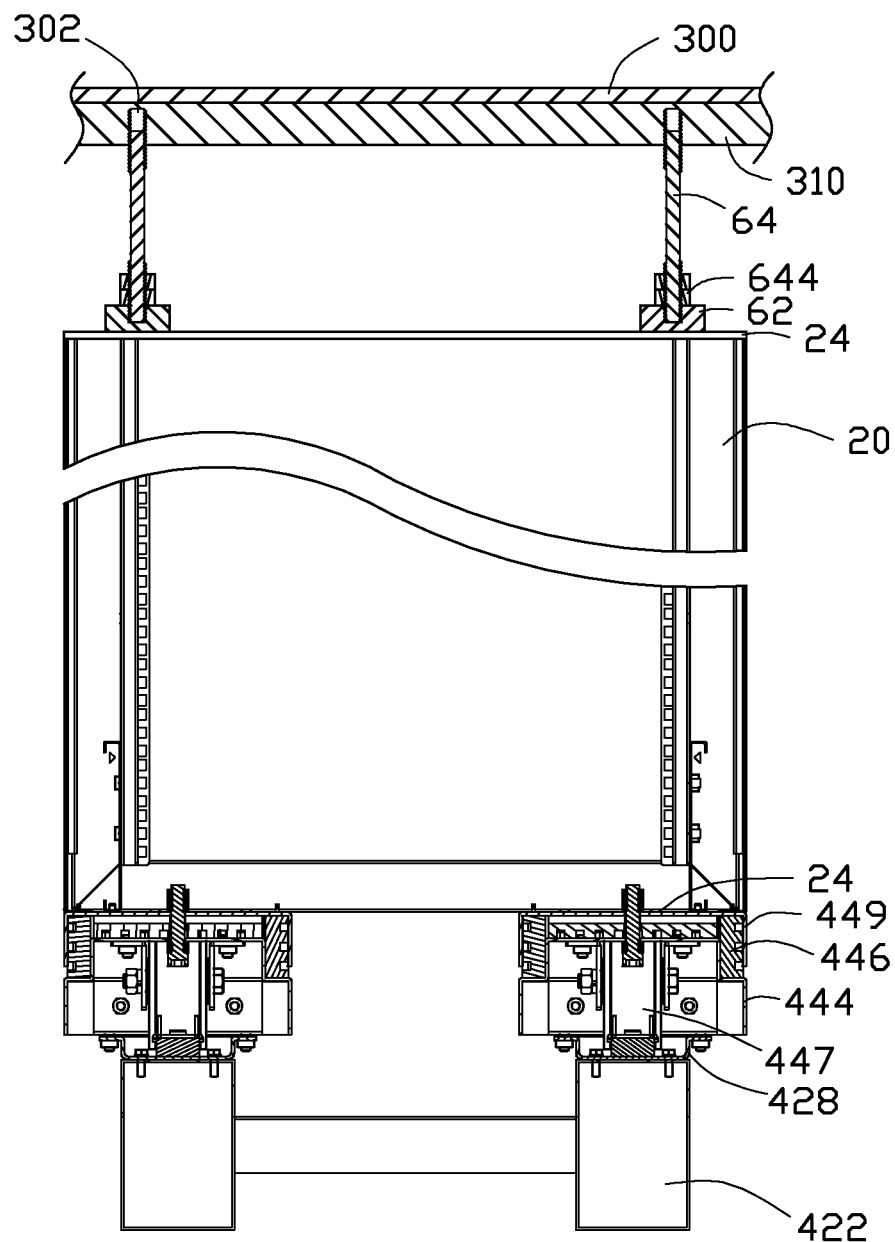
FIG. 6 is similar to FIG. 5, but showing a state of use.
Figure 7:
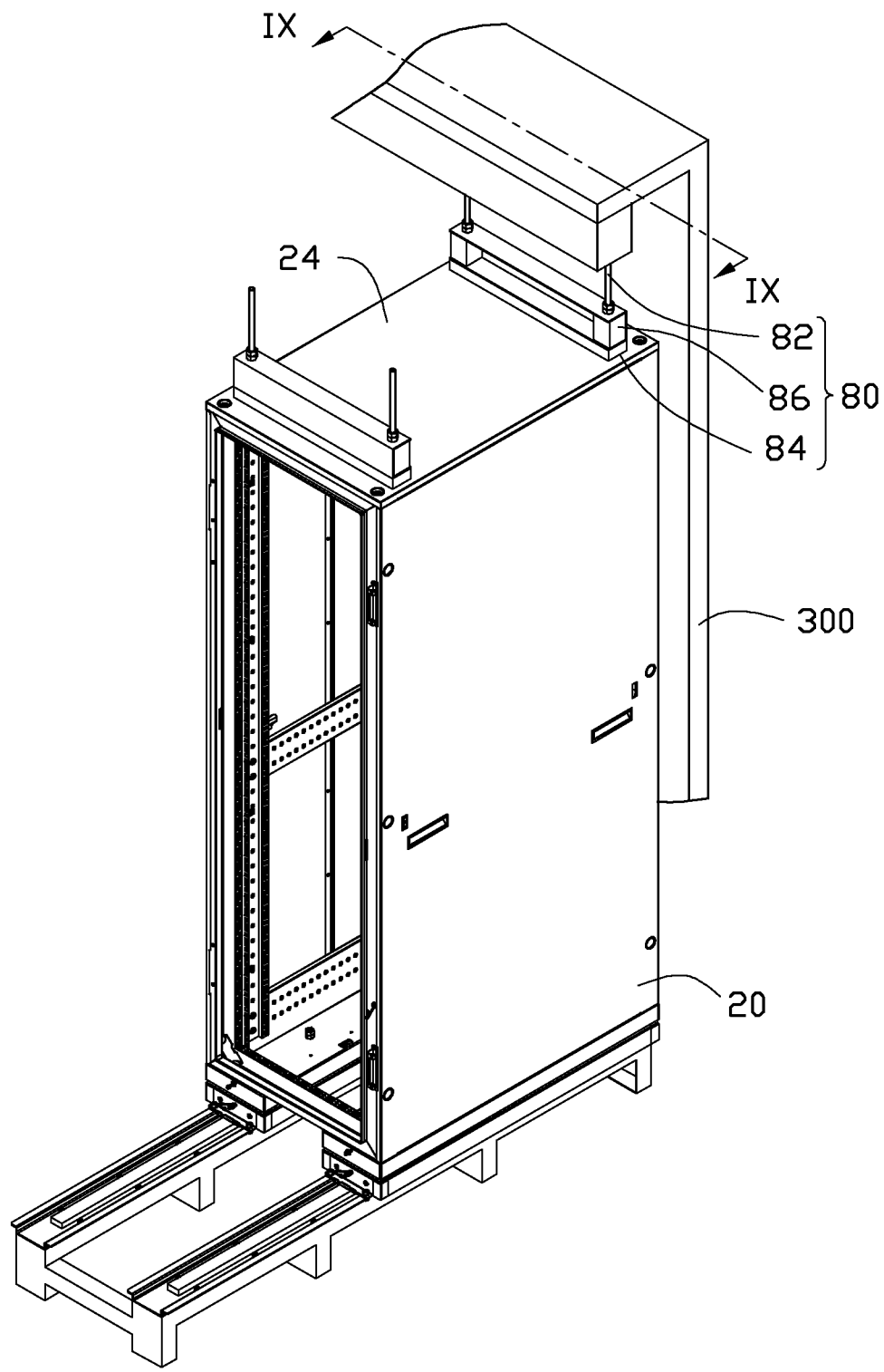
FIG. 7 is an isometric view of a second exemplary embodiment of an assembled container data center, wherein the container data center includes a second shockproof device.
Figure 8:
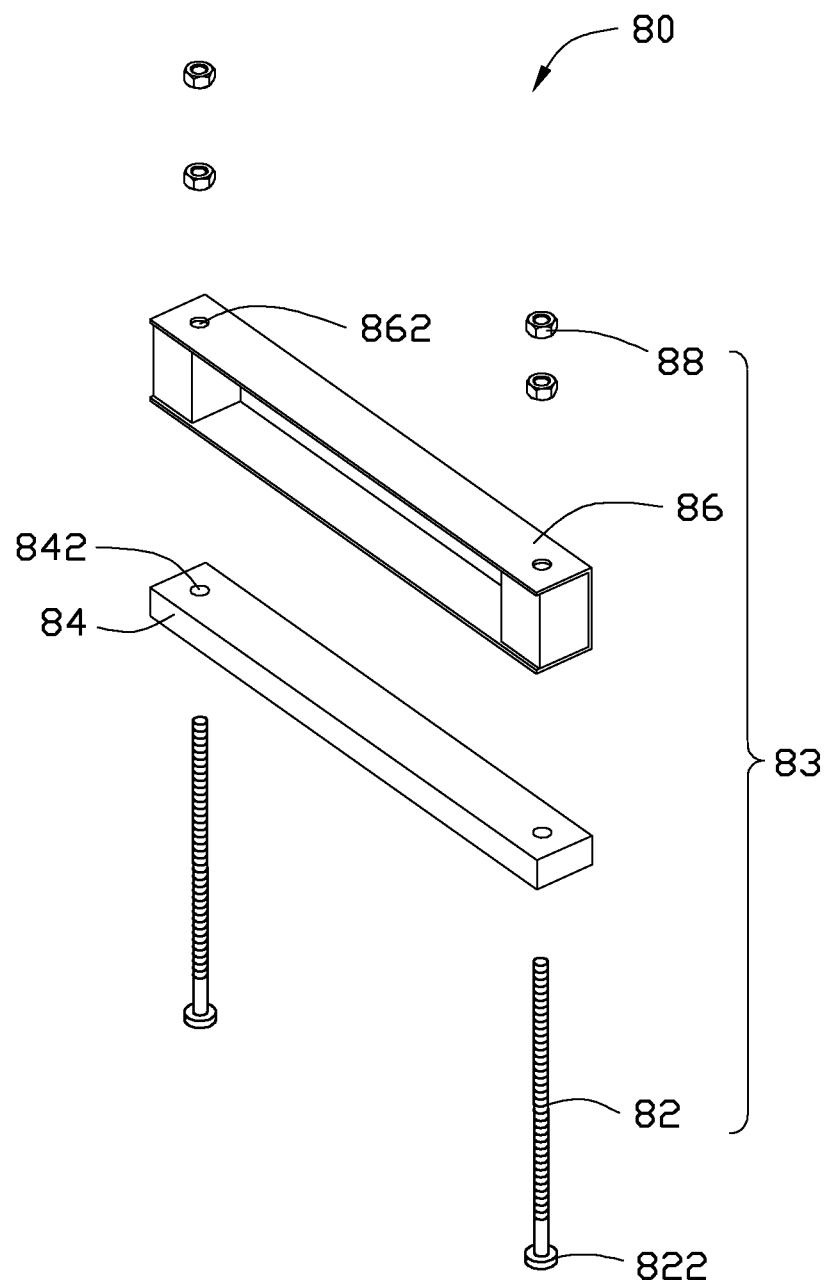
FIG. 8 is an exploded, isometric view of the second shockproof device of FIG. 7.
Figure 9:
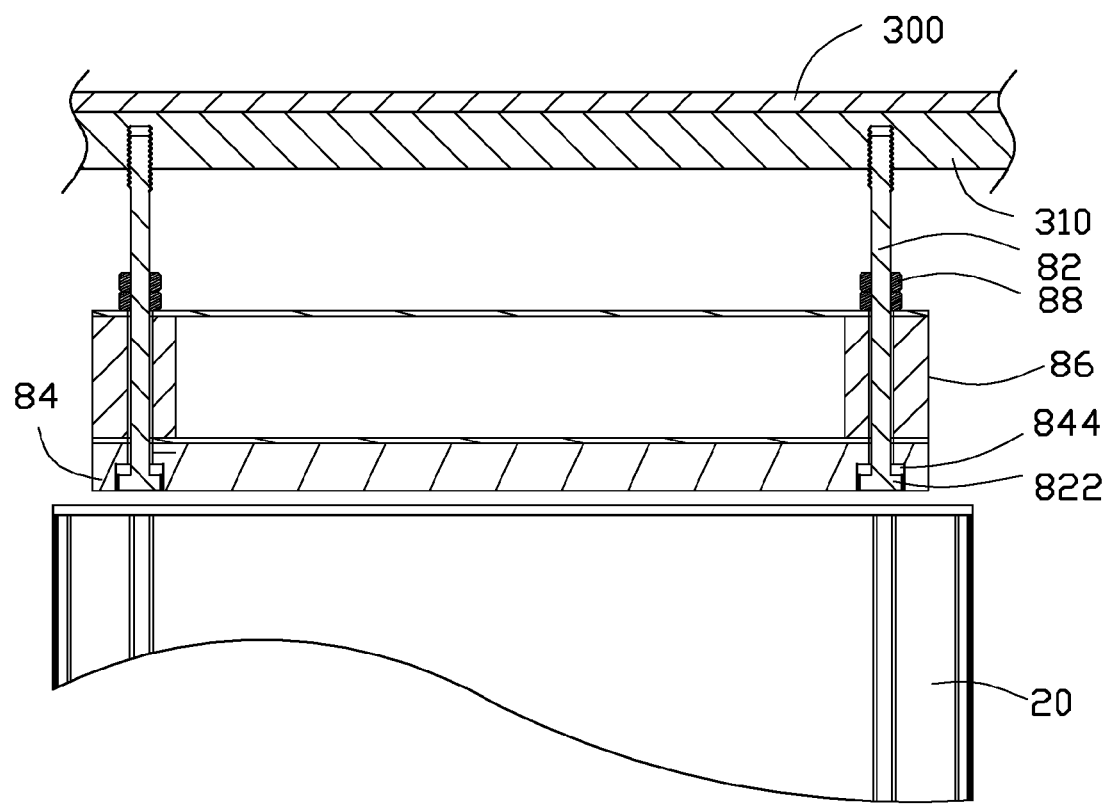
FIG. 9 is a cross-sectional view of FIG. 7, taken along the line of IX-IX.
Figure 10:
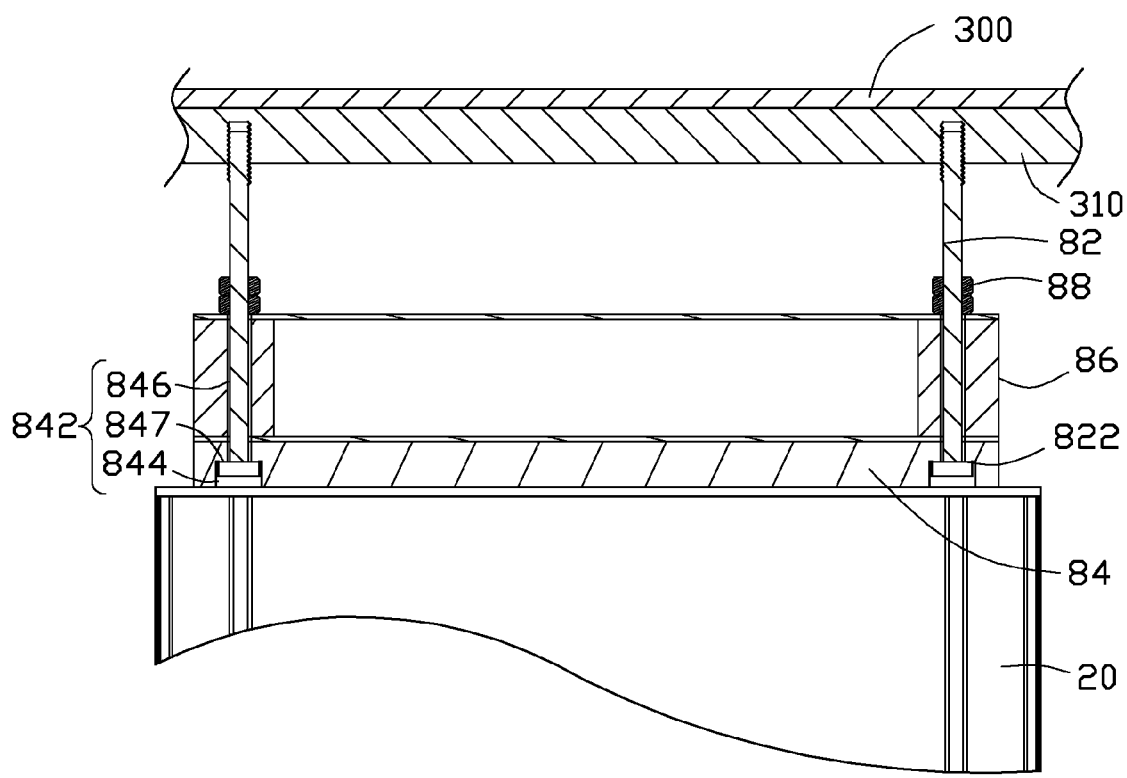
FIG. 10 is similar to FIG. 9, but showing a state of use.

Referring to FIG. 4 to FIG. 6, in assembly, a plurality of screws extends through the through holes 4287, and screw into the screw holes 426. Thereby, the slide rails 428 are fastened on the corresponding supporting bars 424. The bracket 422 is fixed to the bottom wall of the container 300 opposite to the fixing bracket 310 by screws or rivets.

The wheels 4472 are received in the corresponding installing holes 4446 from the bottom of the slide portion 4442. A plurality of screws extends through the through holes 4447, and screw into the screw holes 4476. The first shockproof member 446 is supported on the installing frame 444, to accommodate the fixing portion 4444. The shockproof piece 4462 is supported on the top of the fixing portion 4444, and the shockproof blocks 4464 are supported on the slide portion 4442 around the fixing portion 4444. The cover 449 is covered on the installing frame 444, to accommodate the first shockproof member 446 in the receiving slot 4496. Two screws extend through the mounting holes 4445, the corresponding through holes 4466, and the corresponding through holes 4498, and screw into the bottom wall 22.

One end of each connecting pole 642 extends through the corresponding nuts 644, to be screwed into the screw hole 622. The other end of the connecting pole 642 is screwed into the corresponding screw hole 302 of the fixing bracket 310.

The cabinet 20 is lifted into the container 300. The wheels 4472 are slidably supported on the slide bars 4286. Therefore, the cabinet 20 is slidably supported on the slide rails 428. The cabinet 20 is moved along the slide rails 428, until the top wall 24 aligns with the corresponding second shockproof device 60. A distance between the second shockproof member 62 and the top of the container is adjustable for keeping the second shockproof member 62 abutting the top wall of the cabinet 20. A plurality of the screws extends through the through holes 4449, and screw into the fastening holes 4288, to fix the cabinet 20 in place.

In disassembling the cabinet 20 from the container 300, the connecting poles 642 are rotated to allow the second shockproof members 62 to move away from the top wall 24. The screws are disengaged from the fastening holes 4288 to release the installing frames 444 from the slide rails 428. The cabinet 20 can then be slid out.

When the container 300 is shaken, the first shockproof members 446 and the second shockproof members 62 insulate each cabinet 20 from vibration and shock.

Referring to FIG. 7 to FIG. 10, a second embodiment of a container data center is substantially similar to the first embodiment of the container data center, except that a second shockproof device 80 replaces the second shockproof device 60 of the first embodiment. The second shockproof device 80 includes a long second shockproof member 84 and a connecting member 83. The connecting member 83 includes two screws 82, a bar-shaped latching block 86, and a plurality of nuts 88. In the embodiment, the second shockproof member 84 is made of shockproof material, such as plastic or rubber.

Two stepped holes 842 are defined at opposite ends of the second shockproof member 84. Each stepped hole 842 includes a large diameter hole 844 extending through the bottom of the second shockproof member 84, and a smaller hole 846 extending through the top of the second shockproof member 84 and communicating with the hole 844. A stepped portion 847 is formed at the junction of the large hole 844 and the smaller hole 846.

Two through holes 862 are defined at opposite ends of the latching block 86. The length of the latching block 86 is substantially equal to the length of the second shockproof member 84.

A cylindrical head 822 extends from one end of the screw 82. The diameter of the head 822 is greater than the diameter of the small hole 486, and is less than the diameter of the great hole 844.

In assembly of the second shockproof device 80, the screws 82 extend through the stepped holes 842 from the hole 844, the through holes 862, and the nuts 88, to be screwed into the screw holes 302. The heads 822 are received in the holes 844 and bear against the stepped portions 847. The second shockproof device 80 is mounted to the inner surface of the top of the container 300. The length of the screws 82 in the bracket 310 may be adjusted, thereby allowing the second shockproof member 84 to abut the top wall 24.

When the container 300 is shaken, the first shockproof member 446 and the second shockproof member 84 insulate each cabinet 20 from vibration and shock.

It is to be understood, however, that even though numerous characteristics and advantages of the embodiments have been set forth in the foregoing description, together with details of the structure and function of the embodiments, the present disclosure is illustrative only, and changes may be made in details, especially in the matters of shape, size, and arrangement of parts within the principles of the embodiments to the full extent indicated by the broad general meaning of the terms in which the appended claims are expressed.

What is claimed is:

1. A container data center comprising:
   a container;
   a cabinet arranged in the container, the cabinet comprising a top wall and a bottom wall; and
   a first shockproof device mounted to an inner surface of a top wall of the container, and comprising a first shockproof member made of a shockproof material and a threaded connecting pole, wherein a first end of the connecting pole is mounted to the top wall of the container, a second end of the connecting pole is fixed to the first shockproof member, a distance between the first shockproof member and the top wall of the container is adjustable for keeping the first shockproof member abutting the top wall of the cabinet, the first shockproof member is extendable to abut the top wall of the cabinet, or move away from the top wall of the cabinet.

2. The container data center of claim 1, wherein the first shockproof device further comprises a nut screwed to the second end of the connecting pole above the first shockproof member, to prevent the first shockproof member disengaging from the connecting pole.

3. The container data center of claim 1, wherein the first shockproof device further comprises a latching block, and the second end of the connecting pole extends through the latching block and is fixed to the first shockproof member.

4. The container data center of claim 3, wherein a head extends from the second end of the connecting pole, the first shockproof member defines a stepped hole, the stepped hole comprises a big hole extending through a bottom of the first shockproof member, and a small hole extending through a top of the first shockproof member and communicating with the big hole, the head is accommodated in the big hole and blocked by a stepped portion formed between the big hole and the small hole.

5. The container data center of claim 4, wherein the first shockproof device further comprises a nut screwed to the second end of the connecting pole above the latching block, to prevent the first shockproof member disengaging from the connecting pole.

6. The container data center of claim 1, further comprising a second shockproof device, wherein the second shockproof device comprises a supporting apparatus fixed to an inner surface of a bottom of the container, and a sliding apparatus fixed to a bottom of the bottom wall of the cabinet and slidably supported on the supporting apparatus, the sliding apparatus comprises a second shockproof member made of a shockproof material.

7. The container data center of claim 6, wherein the shockproof material is plastic or rubber.

8. The container data center of claim 1, wherein the shockproof material is plastic or rubber.

9. A container data center comprising:
a container;
a cabinet arranged in the container, the cabinet comprising a bottom wall; and
a shockproof device comprising a supporting apparatus mounted to an inner wall of a bottom of the container, and a sliding apparatus mounted to the bottom wall of the cabinet and slidably mounted to the supporting apparatus, the sliding apparatus comprising a shockproof member made of shockproof material, wherein the supporting apparatus comprises a bracket fixed to the bottom of the container, and a slide rail mounted on a top of the bracket, the sliding apparatus comprises an installing frame, two wheel members are fixed to a bottom of the installing frame, and a cover fixed to the bottom wall of the cabinet, the shockproof member is sandwiched between a top of the installing frame and the cover, the slide rail comprises a slide bar, and each wheel member comprises a wheel slidably supported on the slide bar.

10. The container data center of claim 9, wherein the installing frame comprises a long slide portion and a fixing portion extending up from a middle of the slide portion, the shockproof member comprises four shockproof blocks connected to form a rectangular frame, and a shockproof piece connected between tops of the shockproof blocks at two opposite sides of the frame, the shockproof blocks are supported on the slide portion, the shockproof piece is supported on a top of the fixing portion.

11. The container data center of claim 9, wherein the cover comprises a rectangular top plate and four side plates extending down from four sides of the top plate, the top plate and side plates cooperatively bound a receiving slot, the shockproof member is received in the receiving slot.

* * * * *